United States Patent [19]

Kuwabara et al.

[11] Patent Number: 4,646,132
[45] Date of Patent: Feb. 24, 1987

[54] IC SOCKET HAVING A BACKUP POWER CELL AND CIRCUIT

[75] Inventors: Michiaki Kuwabara, Tokyo; Hiromasa Hayashi, Kamakura, both of Japan

[73] Assignee: Tokyo Shibaura Denki Kabushiki Kaisha, Japan

[21] Appl. No.: 550,046

[22] Filed: Nov. 9, 1983

[30] Foreign Application Priority Data

Nov. 10, 1982 [JP] Japan ................... 57-197116

[51] Int. Cl.$^4$ .................. H01L 23/16; G11C 7/00
[52] U.S. Cl. ...................... 357/80; 357/75; 365/226
[58] Field of Search ............ 357/75, 80, 68, 23.13; 365/226, 229

[56] References Cited

U.S. PATENT DOCUMENTS

| | | | |
|---|---|---|---|
| 3,763,459 | 10/1973 | Millis | 339/75 |
| 3,859,638 | 1/1975 | Hume, Jr. | 340/173 |
| 4,051,945 | 10/1977 | Fujimoto et al. | 365/229 |
| 4,388,706 | 6/1983 | Butler | 365/226 |
| 4,399,524 | 8/1983 | Muguruma et al. | 365/229 |
| 4,403,309 | 9/1983 | Nakano | 365/229 |
| 4,441,119 | 4/1984 | Link | 357/80 |
| 4,460,935 | 7/1984 | Uehira | 357/23.13 |

FOREIGN PATENT DOCUMENTS

| | | | |
|---|---|---|---|
| 2755550 | 6/1979 | Fed. Rep. of Germany | 357/75 |
| 61151 | 5/1981 | Japan | 357/75 |
| 2084769 | 4/1982 | United Kingdom | |

OTHER PUBLICATIONS

ELEKTOR, vol. 7, No. 12, Dec. 1981, Canterbury "IPROM", pp. 1215–1217.
Giveony et al., "Lithium Thyonyl Chloride Batteries for Memory Preservation," WESCON Conference Record, vol. 25, Sep. 1981, El Segundo. CA.

Primary Examiner—William L. Sikes
Assistant Examiner—Frank González
Attorney, Agent, or Firm—Finnegan, Henderson, Farabow, Garrett & Dunner

[57] ABSTRACT

An IC socket is provided which has a cell acting as a back-up cell for an integrated circuit and a back-up circuit for supplying electric power of the cell to the integrated circuit.

10 Claims, 7 Drawing Figures

IC SOCKET HAVING A BACKUP POWER CELL AND CIRCUIT

BACKGROUND OF THE INVENTION

The present invention relates to an IC (integrated circuit) socket for mounting on printed circuit boards, low-power consuming ICs or LSIs such as CMOS memories, CMOS CPUs, or CMOS LSIs which require battery backup.

In an LSI memory of a microcomputer storing a program or data, a timer, a CPU or the like, the memory contents are lost or the operation is terminated upon turning off the power supply. Consequently, the operation cannot be continued after the power supply is resumed. In a device including a memory LSI, in order to prevent accidental loss of memory contents upon turning off the power supply, a backup battery is generally included so as to back up the power supply of the memory LSI.

In a device which is experimentally prepared or which is undergoing testing, demands frequently arise for removing a printed circuit board from a socket connected to a power supply or for removing an IC or an LSI from a socket mounted on a printed circuit board so as to replace the removed IC or LSI with a different IC or LSI. In this case, supply of (backup) power to the removed IC or LSI presents a problem. As one solution to this problem, it has been proposed to arrange a backup battery on a printed circuit board so as to allow free replacement of ICs or LSIs on the printed circuit board without a consequent termination of their functions. However, if only selected ICs or LSIs are to be selectively replaced, the power supply is disconnected, again resulting in power backup difficulty.

SUMMARY OF THE INVENTION

It is, therefore, an object of the present invention to provide an IC socket which has a normal backup function as well as a function for allowing removal or mounting of ICs or LSIs from or on a printed circuit board without consequent termination of their functions, so that each IC and LSI may continue the operation it had been performing prior to its removal after it is remounted on the same or a different printed circuit board.

According to the present invention, an IC socket is provided comprising: an insulator consisting of an insulating material and serving as a base for an IC; a plurality of contact portions of a conductive material, which are formed in said insulator and which receive external leads of said IC; board mounting portions of a conductive material formed in said insulator in correspondence with said contact portions; a power cell arranged in said insulator; and a power backup circuit connected to said contact portions and said board mounting portions and supplying power from said power cell to said IC as a backup power supply.

According to the IC socket of the present invention, the replacement of ICs or LSIs which are mounted on a printed circuit board and which require power backup is facilitated. Handling and transportation of ICs and LSIs are also easy.

DETAILED DESCRIPTION OF THE PREFERRED EMBODIMENTS

Figure 1:
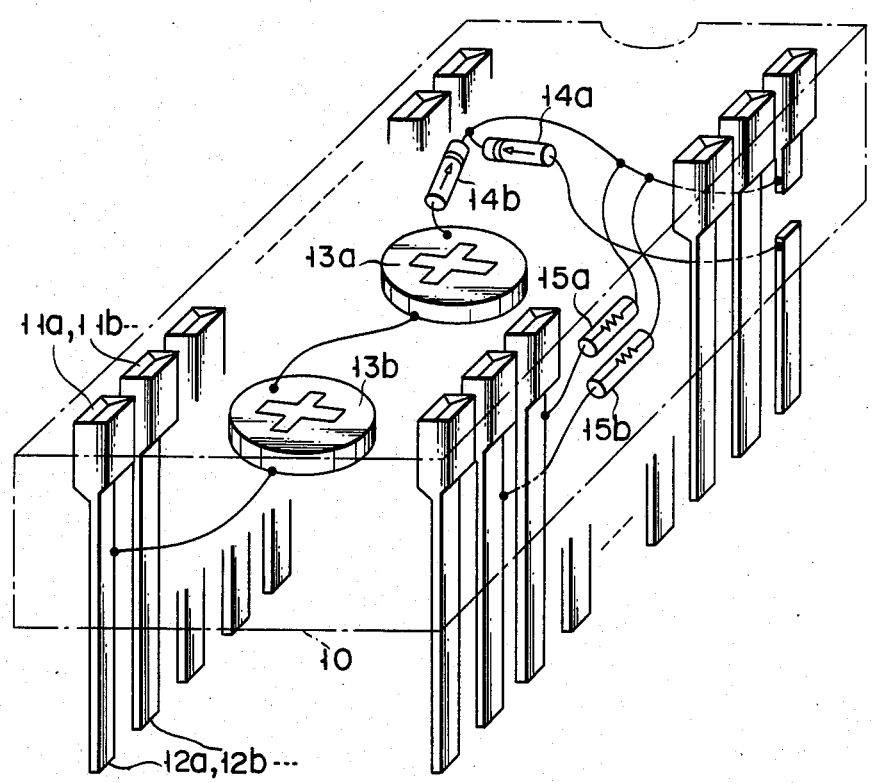
FIG. 1 is a perspective view showing the configuration of an IC socket according to an embodiment of the present invention.

FIG. 1 shows the structure of an IC socket according to an embodiment of the present invention. An insulator 10 (indicated by an alternately long and short dashed line) consists of an insulating resin. A plurality of contact portions 11 (11$a$, 11$b$, ...) of a conductive material are formed in the insulator 10 in correspondence with the external leads of an IC or LSI. Board mounting portions 12 (12$a$, 12$b$, ...) are also formed in the insulator 10 in correspondence with the contact portions 11. Each contact portion 11 and the corresponding board mounting portion 12 are formed into an integral metallic pin so as to serve as a path for an input/output signal exchanged between an external lead of the inserted IC and the printed circuit board wiring connected to the portion 12. Power cells 13 (13$a$, 13$b$) and a power backup circuit consisting of diodes 14$a$ and 14$b$ and resistors 15$a$ and 15$b$ are plastic-encapsulated in the insulator 10. The cells 13$a$ and 13$b$ may be button-type cells such as small silver oxide cells or lithium cells, sheet-type cells, or chargeable secondary cells such as nickel cadmium cells.

When this IC socket is used, a general socket is first soldered on a printed circuit board. Then, the IC socket having the backup function as shown in FIG. 1 of the present invention is inserted into the general socket. Subsequently, an IC or LSI is inserted into the IC socket. When the IC is to be removed, the IC and the IC socket having the backup function are removed simultaneously from the general socket soldered on the board.

Figure 2:
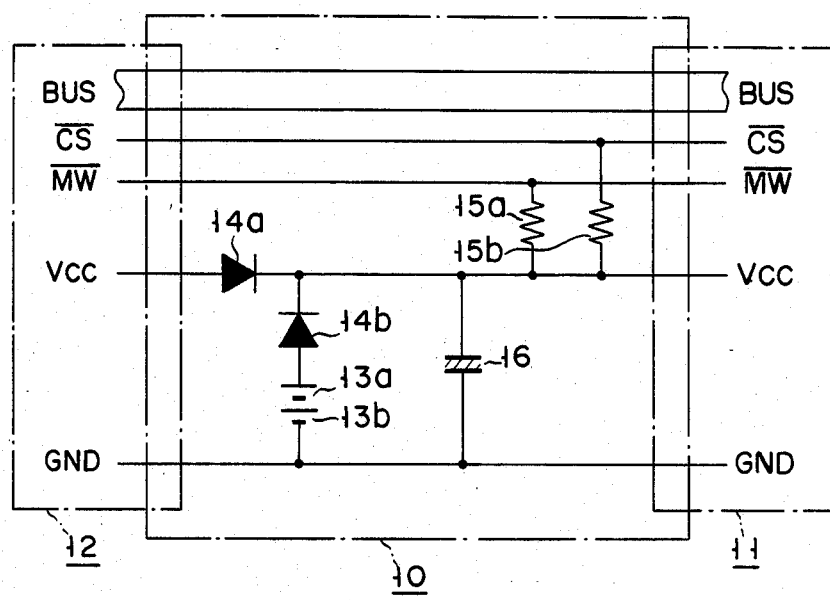
FIG. 2 is a circuit diagram of a backup circuit of the IC socket shown in FIG. 1.

FIG. 2 shows an example of connections of the power backup circuit, the power cells, the contact portions 11, and the board mounting portions 12. A power supply Vcc of the contact portion 11 is connected through the anode and cathode of the diode 14$a$ to a power supply Vcc of the board mounting portion 12 at the side of the printed circuit board. A bus line BUS, a chip select line $\overline{CS}$, a memory write line $\overline{MW}$, and a ground line GND between the board mounting portion 12 and the contact portion 11 are commonly connected. The positive terminal of the cell 13$a$ is connected to the cathode of the diode 14$a$ through the cathode and anode of the diode 14$b$. The negative terminal of the cell 13$b$ series-connected to the cell 13$a$ is connected to the ground line GND. One electrode of a capacitor 16 is common connected to the cathodes of the diodes 14$a$, 14b and the other electrode of the capacitor 16 is connected to the ground line GND. The resistor 15a is inserted between the cathodes of the diodes 14a, 14b and the memory write line $\overline{MW}$, and the resistor 15b is inserted between the cathodes of the diodes 14a, 14b and the chip select line $\overline{CS}$. The bus line BUS is a line for transmitting address signals, data signals and so on and is an input/output line which does not cause erratic operation or loss of memory contents even if a given potential is not applied to the input terminal of the IC or LSI. The diodes 14a and 14b are included so as to prevent application of a reverse voltage to the IC or LSI or short-circuiting of the cells 13a and 13b. The resistors 15a and 15b fulfill a pull-up function for the memory write line $\overline{MW}$ and the chip select line $\overline{CS}$, respectively. The capacitor 16 accumulates charge from the printed circuit board or the cells 13a and 13b and also absorbs a spike voltage which is produced when the IC socket is removed from the printed circuit board or is connected to another printed circuit board.

The pin arrangement of the ICs or LSIs of CPUs or memories is standardized. Accordingly, the power supply and the input/output lines of the above configuration are connected to the board mounting portions 12 and the contact portions 11 which correspond to the pin arrangement of the CPU or memory LSI selected.

The mode of operation of an assembly wherein the circuit having the configuration as described above is incorporated into the IC socket will now be described. First, the external leads of an IC (or LSI) are inserted into the contact portions 11. When power is supplied from the printed circuit board, it is supplied to the IC (or LSI) through the diode 14a in the IC socket. Then, signals from the printed circuit board are supplied to the chip select line $\overline{CS}$ and the memory write line $\overline{MW}$, and signals are exchanged between the printed circuit board and the IC side through the bus line BUS.

When the IC is to be temporarily removed from the printed circuit board, it is removed simultaneously with the IC socket into which the external leads of the IC are inserted. At this time, power supply to the IC from the printed circuit board is stopped. However, power is supplied to a power supply line Vcc from the power cells 13a and 13b through the diodes 14b. Due to this supply of power, signals of high level are supplied to the memory write line $\overline{MW}$ and the chip select line $\overline{CS}$ through the pull-up resistors 15a and 15b, thereby sustaining the IC in the operative mode.

In this manner, the power backup circuit and auxiliary power supply cells are incorporated in the IC socket. When the IC is handled as mounted on such an IC socket, the memory contents written in the IC are not lost, and replacement or transportation of ICs can be performed without problem. When a once removed IC is again mounted on the printed circuit board, it can then continue the operation it had been performing prior to its removal from the printed circuit board. With the IC socket of the present invention, the IC socket is not limited to use for a particular type of IC and can be made a general purpose IC socket.

Figure 3:
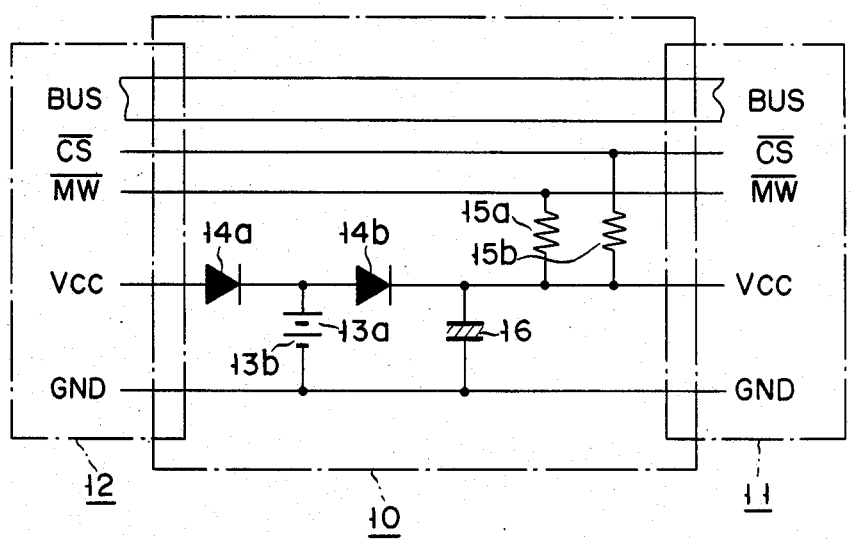
FIG. 3 is a circuit diagram showing another configuration of a backup circuit of the IC socket shown in FIG. 1.

FIG. 3 shows another example of the configuration of the backup circuit different from that shown in FIG. 2. The same reference numerals as used in FIG. 2 denote the same parts in FIG. 3, and a detailed description thereof will be omitted. In this example, the diode 14b shown in FIG. 2 is inserted between the power supply line Vcc of the contact portion 11 and the cathode of the diode 14a. With this configuration, the backup circuit operates in a similar manner and provides the same effect as in the circuit shown in FIG. 2.

Figure 4:
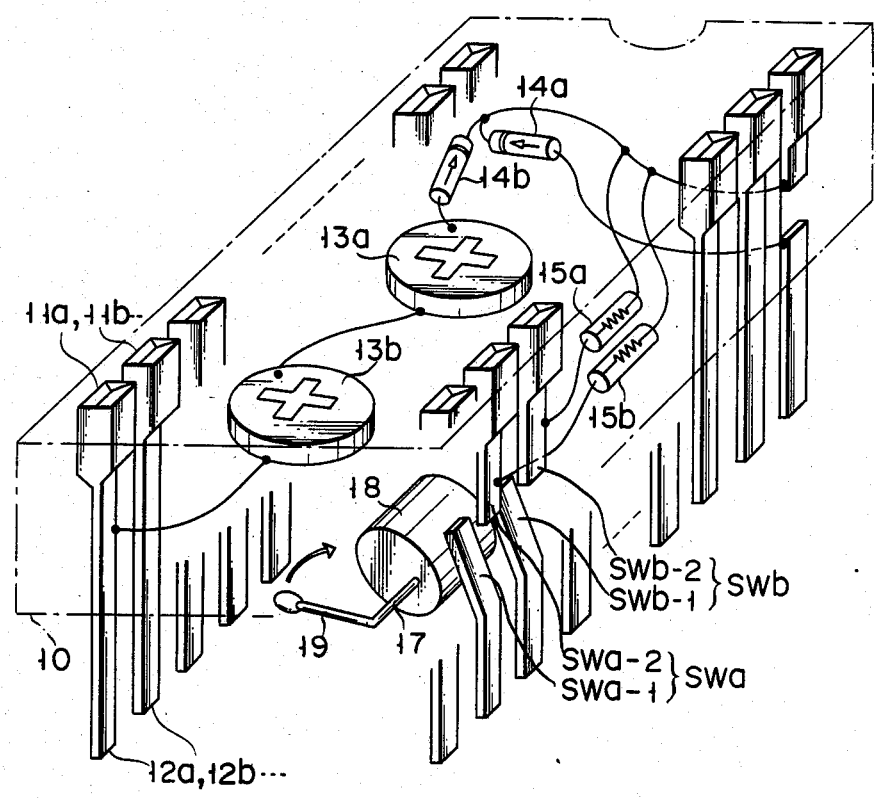
FIG. 4 is a perspective view of an IC socket according to another embodiment of the present invention.

FIG. 4 shows another embodiment of the present invention. In the configuration shown in FIG. 1, when the chip select line $\overline{CS}$ or the memory write line $\overline{MW}$ is grounded for some reason during the backup operation effected by means of the cells 13a and 13b, data is lost. The IC socket in FIG. 4 is designed to prevent this. Referring to FIG. 4, the same reference numerals as used in FIG. 1 denote the same parts, and a detailed description thereof will be omitted. In this embodiment, the metallic pins each consisting of an integral combination of a contact portion 11 and a board mounting portion 12 are used as stationary and movable contacts of switches SWa, SWb. The switches SWa, SWb turn on/off a chip select line $\overline{CS}$ and a memory write line $\overline{MW}$ between the board mounting portions 12 and the contact portions 11. The switches SWa, SWb are turned on/off by a press member 18 eccentrically mounted on one end of a pivot pin 17. A lever 19 is connected to the other end of the pivot pin 17. The movable contacts SWa-1, SWb-1 are connected to the stationary contacts SWa-2, SWb-2 of the switches SWa, SWb when the lever 19 is pivoted in the direction indicated by an arrow.

When the IC socket having the above configuration is used as mounted on a printed circuit board, the switch is turned on by the lever 19. The switch is turned off when the IC is to be removed from the printed circuit board. Then, the chip select line $\overline{CS}$ and the memory write line $\overline{MW}$ are not grounded, and data is not lost.

Figure 5:
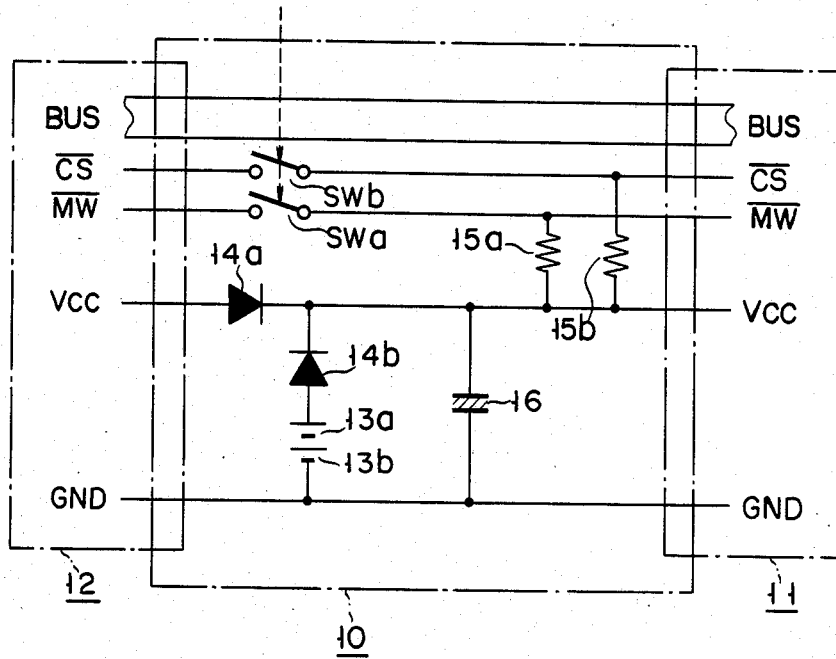
FIG. 5 is a circuit diagram showing a backup circuit of the IC socket shown in FIG. 4.
Figure 6:
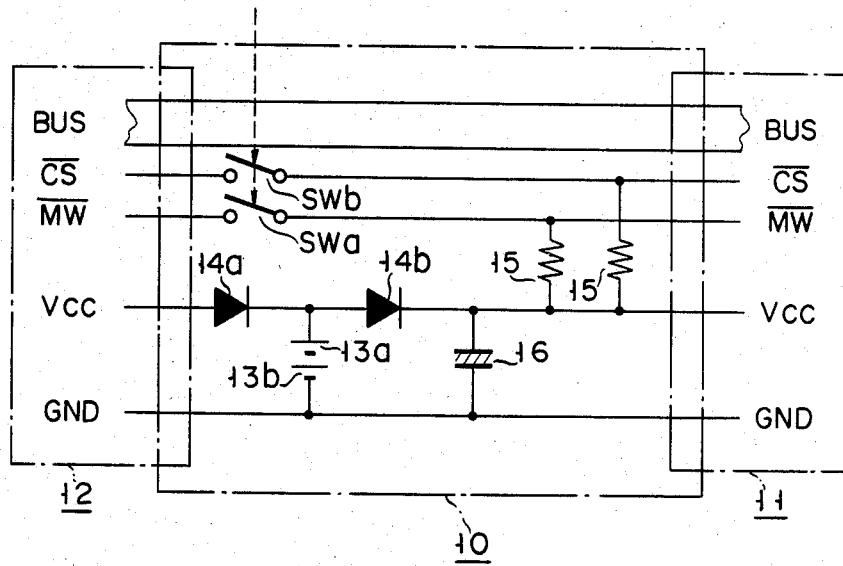
FIG. 6 is a circuit diagram showing another configuration of a backup circuit of the IC socket shown in FIG. 4.

FIGS. 5 and 6 show examples of backup circuits of the IC socket shown in FIG. 4. Referring to FIG. 5, switches SWa and SWb are inserted in the chip select line $\overline{CS}$ and the memory write line $\overline{MW}$, respectively, between the board mounting portions 12 and the contact portions 11 in the circuit shown in FIG. 2. Referring to FIG. 6, switches SWa and SWb are similarly inserted in the circuit shown in FIG. 3.

Figure 7:
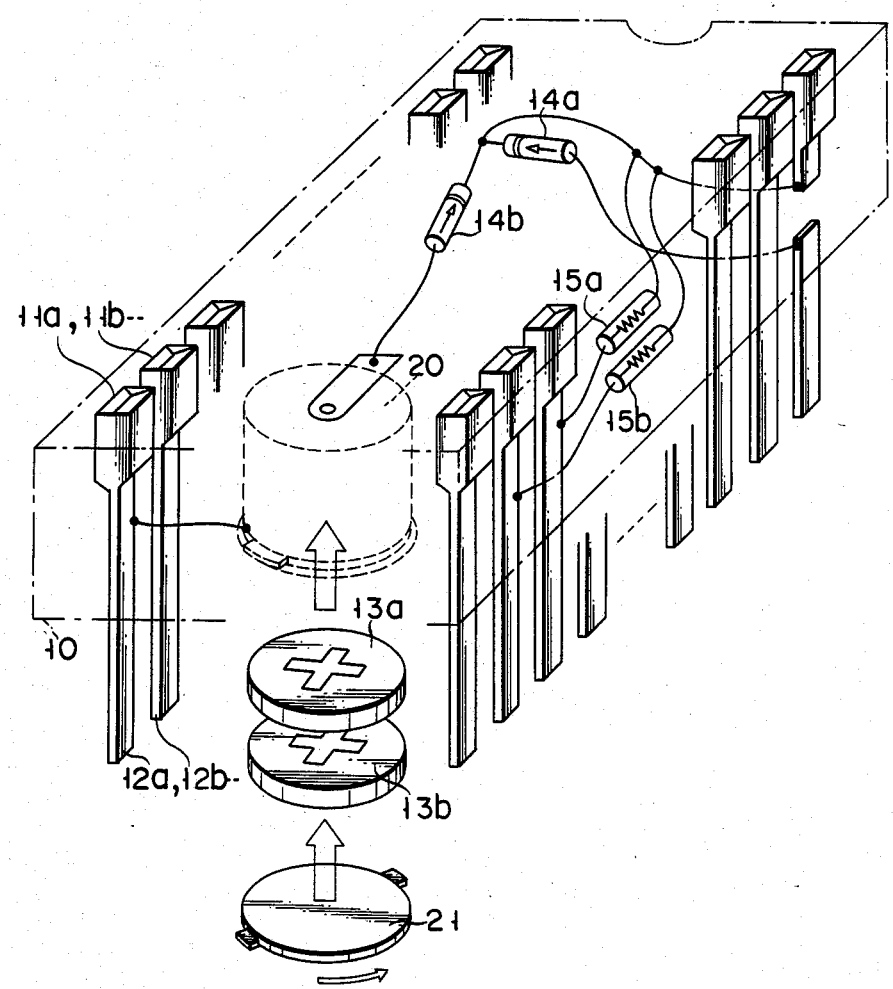
FIG. 7 is a perspective view showing the configuration of an IC socket according to still another embodiment of the present invention.

FIG. 7 shows still another embodiment of the present invention. In earlier embodiments, the cells 13a and 13b are plastic-encapsulated. However, in this embodiment, cells 13a and 13b are replaceable. More specifically, a cell holder 20 is arranged in an insulator 10, and the cells 13a and 13b are housed in the holder 20. A lid 21 is closed. Then, the positive terminal of the cell 13a is connected to a diode 14a, and the negative terminal of the cell 13b is connected to a ground line GND.

The above description has been made with reference to a backup circuit of a memory LSI. However, the present invention is not limited to this. The IC socket of the present invention may be suitably designed in accordance with any IC or LSI with which it is to be used. The elements assembled in the insulator 10 are not limited to resistors, capacitors or diodes. For example, a low-power consumption, compact, flat package-type IC may be assembled in the insulator 10. The IC socket of the present invention is not limited to a memory LSI but may be applied to a CPU or a timer IC. When the IC socket of the present invention is used for a CPU or a timer IC, removal or remounting of the IC can be performed without interrupting operation of the CPU or IC. This is particularly effective for checking printed circuit boards.

What is claimed is:

1. An integrated circuit socket for connecting an integrated circuit to a printed circuit board, comprising:

an insulator consisting of an insulating material and serving as a base for an integrated circuit;

a plurality of contact portions of a conductive material arranged in said insulator and adapted to receive external leads of an integrated circuit, said contact portions including a first contact portion adapted to connect to a memory write line in an integrated circuit and a second contact portion adapted to connect to a chip select line in an integrated circuit;

board mounting portions of a conductive material arranged in said insulator in correspondence with said contact portions and adapted to connect to corresponding receiving portions arranged in a printed circuit board, said board mounting portions including a first board mounting portion corresponding to said first contact portion and a second board mounting portion corresponding to said second contact portion;

a power cell built into said insulator;

a power backup circuit connected to said contact portions and said board mounting portions and supplyinh power from said power cell as backup power for said integrated circuit;

a first switch disposed between said first contact portion and said first board mounting portion, said first switch being operable between a first position in which said first contact portion and said first board mounting portion are electrically connected and a second position in which said first contact portion and said first board mounting portion are electrically disconnected; and a second switch disposed between said second contact portion and said second board mounting portion, said second switch being operable between a first position in which said second contact portion and said second board mounting portion are electrically connected and a second position in which said second contact portion and said second board mounting portion are electrically disconnected.

2. An integrated circuit socket according to claim 1, wherein said power cell and said power backup circuit are sealed in said insulator.

3. An integrated circuit socket according to claim 1, wherein said insulator has a power cell holder, and said power cell is replaceable.

4. An integrated circuit socket according to claim 1, wherein said insulator is formed of a resin.

5. An integrated circuit socket according to claim 1, wherein said contact portions include a third contact portion adapted to connect to a power supply line of an integrated circuit and a fourth contact portion adapted to connect to a ground line of an integrated circuit;

said board mounting portions include a third board mounting portion adapted to connect to a power supply line of a printed circuit board; and said power backup circuit includes a first diode having an anode electrically connected to said third board mounting portion and a cathode electrically connected to said third contact portions, a second diode having a cathode electrically connected to said cathode of said first diode and an anode electrically connected to a positive terminal of said power cell, a capacitor electrically connected between said cathode of said first diode and said fourth contact portion, a first resistor electrically connected between said cathode of said first diode and said first contact portion, and a second resistor electrically connected between said cathode of said first diode and said second contact portion.

6. An integrated circuit socket according to claim 1, wherein said contact portions include a third contact portion adapted to connect to a power line of an integrated circuit and a fourth contact portion adapted to connect to a ground line of an integrated circuit;

said board mounting portions include a third board mounting portion adapted to connect to a power supply line of a printed circuit board; and said power backup circuit includes first and second diodes electrically connected in series between said third board mounting portion and said third contact portion, a capacitor electrically connected between a cathode of said second diode and said fourth contact portion, a first resistor electrically connected between said cathode of said second diode and said first contact portion, and a second resistor electrically connected between said cathode of said second diode and said second contact portion.

7. An integrated circuit socket according to claim 5, wherein said first and second contact portions respectively act as stationary contacts of said first and second switches, and first and second said board mounting portions respectively act as movable contacts of said first and second switches.

8. An integrated circuit socket according to claim 6, wherein said first and second contact portions respectively act as stationary contacts of said first and second switches, and said first and second board mounting portions respectively act as movable contacts of said first and second switches.

9. An integrated circuit socket according to claim 7, wherein said first and second switches include pressing means for selectively moving said first and second board mounting portions into and out of contact with said first and second contact portions respectively.

10. An integrated circuit socket according to claim 8, wherein said first and second switches include pressing means for selectively moving said first and second board mounting portions into and out of contact with said first and second contact portions respectively.

* * * * *